United States Patent [19]

Tigelaar et al.

[11] Patent Number: 5,595,922
[45] Date of Patent: Jan. 21, 1997

[54] PROCESS FOR THICKENING SELECTIVE GATE OXIDE REGIONS

[75] Inventors: Howard L. Tigelaar, Allen; Bert R. Riemenschneider, Plano; Richard A. Chapman; Andrew T. Appel, both of Dallas, all of Tex.

[73] Assignee: Texas Instruments, Dallas, Tex.

[21] Appl. No.: 330,655

[22] Filed: Oct. 28, 1994

[51] Int. Cl.$^6$ .......................... H01L 21/265; H01L 21/70; H01L 27/00
[52] U.S. Cl. .............................. 437/40; 437/56; 437/979; 437/983
[58] Field of Search .............................. 437/41, 983, 979, 437/29, 40 GS, 56; 148/DIG. 117, DIG. 116, DIG. 118

[56] References Cited

U.S. PATENT DOCUMENTS

| | | | |
|---|---|---|---|
| 4,313,256 | 2/1982 | Widmann | 437/41 |
| 4,516,313 | 5/1985 | Turi et al. | 437/29 |
| 5,057,449 | 10/1991 | Lowrey et al. | 437/60 |
| 5,208,175 | 5/1993 | Choi et al. | 437/43 |
| 5,314,834 | 5/1994 | Mazure et al. | 437/43 |
| 5,371,026 | 12/1994 | Hayden et al. | 437/41 |

FOREIGN PATENT DOCUMENTS

| | | |
|---|---|---|
| 0244367 | 4/1987 | European Pat. Off. . |
| 02187063 | 7/1990 | Japan . |
| 2-230775 | 9/1990 | Japan ..................................... 437/983 |

*Primary Examiner*—George Fourson
*Assistant Examiner*—Brian K. Dutton
*Attorney, Agent, or Firm*—Mark A. Valetti; W. James Brady, III; Richard L. Donaldson

[57] ABSTRACT

One embodiment of the present invention is a method of simultaneously forming high-voltage (12) and low-voltage (10) devices on a single substrate (14), the method comprising: forming a thin oxide layer (18) on the substrate, the thin oxide layer having a desired thickness for a gate oxide for the low-voltage device; selectively forming a gate structure (30) for the high-voltage device, the thin oxide is situated between the gate structure and the substrate; and selectively thickening the thin oxide under the gate structure while keeping the thin oxide layer utilized for the low-voltage device at the desired thickness.

14 Claims, 2 Drawing Sheets

PROCESS FOR THICKENING SELECTIVE GATE OXIDE REGIONS

FIELD OF THE INVENTION

The instant invention relates to semiconductor devices and methods of forming the same, and, more specifically, to a process of forming transistors.

BACKGROUND OF THE INVENTION

Some circuits require low-voltage and high-voltage devices on the same chip. Examples include EPROM and EEPROM devices, which require high-voltage transistors for programming, and low-voltage logic devices which require high-voltage transistors to handle higher external power supply voltages. Due to the different voltage requirements for these two types of devices, the gate oxides need to have different thicknesses. More specifically, the high voltage transistor requires a thicker gate oxide to support the higher voltage, whereas the low-voltage transistor requires a thinner gate oxide. The standard process for producing different gate oxide thicknesses is to pattern the high voltage gate oxide and to remove this oxide from the low voltage areas by etching. The process of patterning directly on the gate oxide causes a reduction in yield.

It is the object of the present invention to provide submicron high-voltage and low-voltage transistors on the same chip without having to pattern and etch the high voltage gate oxide.

SUMMARY OF THE INVENTION

One embodiment of the present invention is a method of simultaneously forming high-voltage and low-voltage devices on a single substrate, the method comprising: forming a thin oxide layer on the substrate, the thin oxide layer having a desired thickness for a gate oxide for the low-voltage device; selectively forming a gate structure for the high-voltage device, the thin oxide is situated between the gate structure and the substrate; and selectively thickening the thin oxide under the gate structure while keeping the thin oxide layer utilized for the low-voltage device at the desired thickness.

Another embodiment of the present invention is a method of simultaneously forming high-voltage and low-voltage transistors on a single substrate for an electrical device structure, the method comprising: providing a substrate, the substrate having a region for the high-voltage transistor and a region for the low-voltage transistor; forming a thin oxide layer on the substrate, the thin oxide layer having a first thickness; forming a conductive layer on the thin oxide layer, the conductive layer covering the thin oxide layer and the substrate in the regions for the high-voltage and low-voltage transistors; selectively removing portions of the conductive layer to form a gate structure for the high-voltage transistor and so as to leave the conductive layer remaining in the region for the low-voltage transistor; selectively thickening the thin oxide layer under the gate structure to a second thickness while leaving the remaining portion of the thin oxide layer at the first thickness; and selectively removing portions of the remaining conductive layer in the low-voltage transistor region so as to form a gate structure for the low-voltage transistor, the thin oxide layer having a thickness of the first thickness is disposed between the low-voltage transistor gate structure and the substrate. Depending upon the final gate oxide thickness required, a blocking layer may be formed on the conductive layer prior to the removing portions of the conductive layer and portions of the blocking layer are removed with the removal of portions of the conductive layer. The blocking layer is comprised of a material selected from the group of: silicon nitrides (preferably $Si_2N_4$), titanium nitrides (preferably TiN), or any combination thereof. In addition the process step of selectively thickening the thin oxide layer can be performed by subjecting the device structure to a wet or a dry oxidizing atmosphere at between 800° C. and 1000° C. If a dry oxidizing atmosphere is utilized the device is subjected to the atmosphere for 30 to 50 minutes, whereas, if a wet oxidizing atmosphere is utilized the device will be subjected to the atmosphere for 10 to 50 minutes. The result of these process will be the thickening of the oxide to approximately 80 and 100Å for a gate structure that is approximately 0.6 μm wide when the gate oxide remains at 50 and 70Å for a gate structure that is approximately 0.35 μm wide.

DETAILED DESCRIPTION OF THE INVENTION

One embodiment of the instant invention is a process flow whereby a high-voltage ("HV") transistor is formed simultaneously with a low-voltage ("LV") transistor. This process flow is illustrated as a flow chart in FIG. 5 and as a series of cross-sectional device diagrams in FIGS. 1–4. In order to more clearly illustrate the process flow of the present invention, the following description will be centered around the cross-sectional view of the LV and HV transistors formed (devices 10 and 12, respectively) in FIGS. 1–4 so as to illustrate the step-by-step formation of these devices. In conjunction with the description of the fabrication of LV transistor 10 and HV transistor 12 as they relate to FIGS. 1–4, the process flow illustrated in FIG. 5 will also be discussed.

Figure 1:
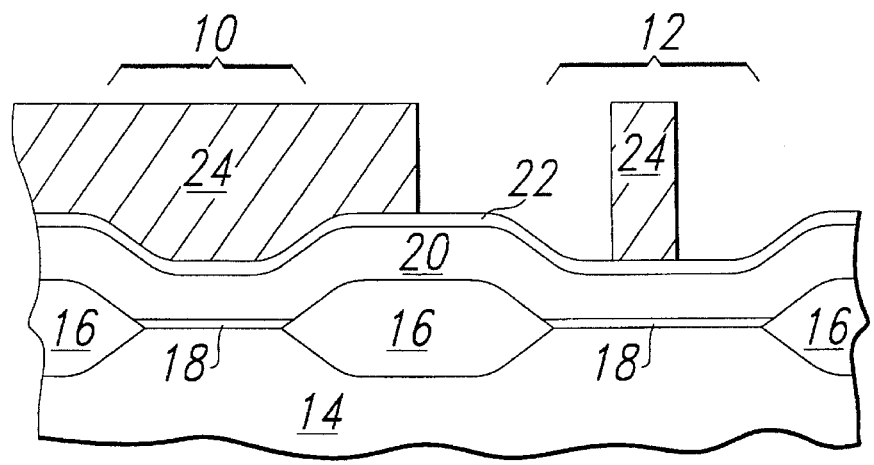
FIGS. 1–4 are cross sectional diagrams of two semiconductor devices fabricated with the process of one embodiment of the present invention.

Referring to FIG. 1, after providing a semiconductor substrate (preferably p-type or n-type doped silicon) an epitaxial silicon layer may be formed on the substrate. However, depending on the actual device structure, an epitaxial layer may or may not be required. Therefore, in order to simplify the following discussion, region 14, which may represent the substrate or an epitaxial layer, will simply be referred to as substrate 14. Next, transistor isolation regions 16 are formed (this corresponds to step 504 of FIG. 5). Preferably field oxide regions 16 are grown by subjecting substrate 14 to a wet oxygen atmosphere (such as steam) or a dry oxygen atmosphere. Gate oxide 18 is then grown and preferably optimized to the thickness required for the low voltage transistor. Polysilicon gate 20 is then deposited (step 506 of FIG. 5) and doped to improve conductivity. Next, a layer of material 22 which blocks oxidation, such as silicon nitride or titanium nitride, is deposited on the polysilicon. This step corresponds to step 510 in FIG. 5. Depending upon how much oxidation is required to increase the thickness of the high-voltage transistors, this blocking layer may be omitted. For purposes of illustration in this embodiment the oxide blocking layer will be included.

Next a photoresist layer 24 is formed and patterned on oxidation blocking layer 22. The photoresist layer 24 is used to selectively etch layer 22 and polysilicon layer 20 in high-voltage transistor 12 areas while blocking the etch in low-voltage transistor 10 areas.

Figure 2:
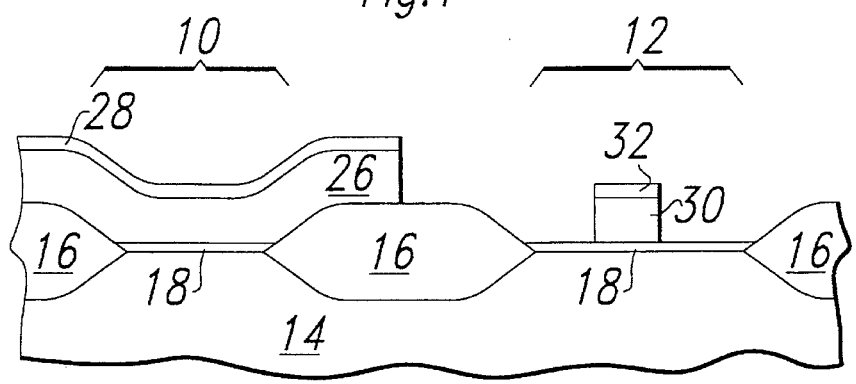

Now referring to FIG. 2, after selectively etching, gate structures 30 are defined in the high-voltage areas. The low-voltage transistor areas are covered with polysilicon layer 26 capped with the oxidation blocking layer 28, and gate structure 30 is capped with cap insulator 32 (which is preferably the same material as oxidation blocking layer 28). This step corresponds to set 512 in FIG. 5.

Figure 3:
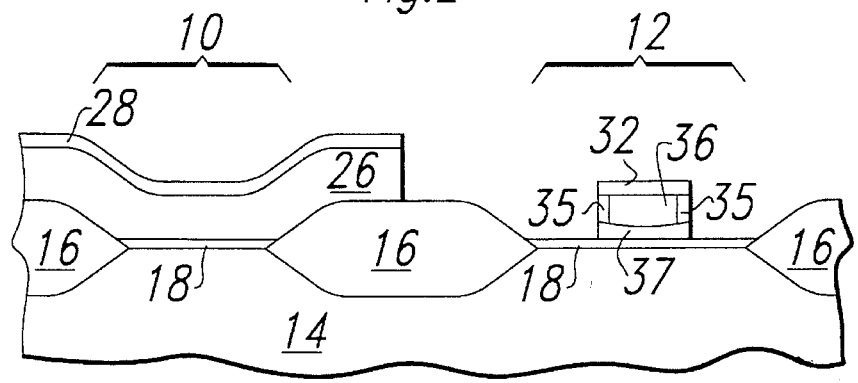

Referring to FIG. 3, after the selective etch is performed, so as to form high voltage gate structure 30, an oxidation is performed. (Step 514 of FIG. 5) This oxidation causes a bird's beak at the gate edges and also increases the oxide thickness across the channel (collectively referred to as insulating region 34). See "Sidewall Oxidation of Polycrystalline-Silicon Gate," IEEE Electron Device Letters, Vol. 10 No. 9, Sept. 1989, pp. 420–422, which is incorporated herein. The oxidation time can be chosen to produce the desired high-voltage gate oxide thickness. Wet oxidation increases the gate oxide thickness faster than dry oxidation. The type of oxidation selected is based upon voltage and reliability requirements of high-voltage transistor 12.

The lateral extent of polysilicon layer 26 is particularly important because it directly affects the extent in which an oxide region will be formed under the polysilicon. The polysilicon oxide growth process step is performed so as to grow an oxide region under an entire narrow polysilicon structure (such as poly silicon gate structure 36) but not to grow oxide under polysilicon in region 10. In fact, an entire oxide layer and a pair of "birds beaks" are formed (see region 34 in FIG. 3) under gate structure 36, whereas, "bird's beaks" will be formed only at the edge of polysilicon plate 26. This bird's beak is over the isolation oxide region 16 where it has no impact on the low voltage transistor performance.

In addition to the growth of oxide region 34, oxide regions 35 are grown on the sides of gate structure 36 during the polysilicon oxide formation process step. Since these oxide regions are thermally grown, they basically form thin sidewall insulators for gate structure 36. In addition, since they are thermally grown, they seal gate structure 36 so as to reduce any electrical leakage from gate structure 36.

In another embodiment of the instant invention, with oxidizing blocking layer 28 covering any exposed portions of the substrate, an oxide layer can be thickened to approximately 90 to 125Å thick (for a gate structure having a width of 0.6 μm—or approximately 60Å thick for a gate structure having a width of 0.35 μm) under gate structure 30. Such a process would preferably be performed at between 800° and 950° C. (more preferably around 850° C.) for 30 to 40 minutes in a dry oxidizing atmosphere or 10 to 30 minutes in a wet (preferably steam) oxidizing atmosphere.

Figure 4:
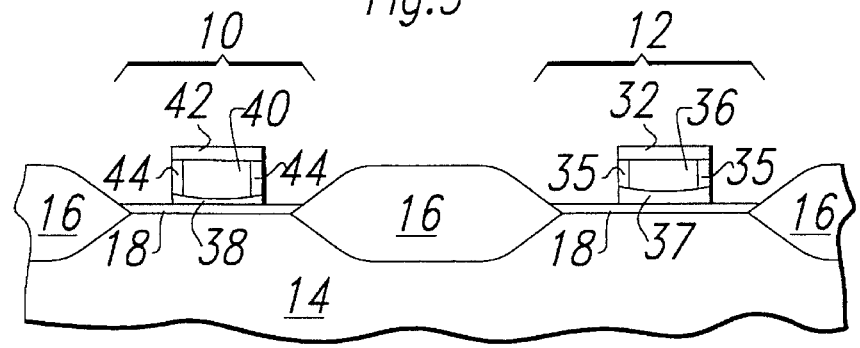

Referring to FIG. 4, the next process step to be performed is a patterning and etching of oxidation blocking layer 28 (to form oxidation blocking cap 42) and polysilicon layer 26 to form the gates of low-voltage transistor 10. (See step 516 in FIG. 5). After this gate structure is formed another polysilicon oxide growth step (represented as step 518 in FIG. 5) may or may not be performed. If this step is performed, the result is to form short "bird's beak" regions (region 38) over the source and drain overlap regions of low-voltage transistor 10 without increasing the thickness of low-voltage gate oxide 18 in the rest of the channel. In addition, thin side wall oxides 44 are formed on the sides of gate structure 40.

As was stated above, this step may or may not be performed. An advantage to performing at least a minimal oxide growth step is that it will form the "bird's beak" regions at the lower corners of gate structure 40 (between gate structure 40 and oxide layer 18). This is beneficial because it shifts the source/drain implantation damage away form the gate structure, it reduces the gate-to-source/drain overlap capacitance, and it reduces the electric field intensity at the corner of the gate structure. Another advantage is that this oxide growth step forms thin side wall insulators on the gate structures so as to reduce the electrical leakage from the gate.

Figure 5:
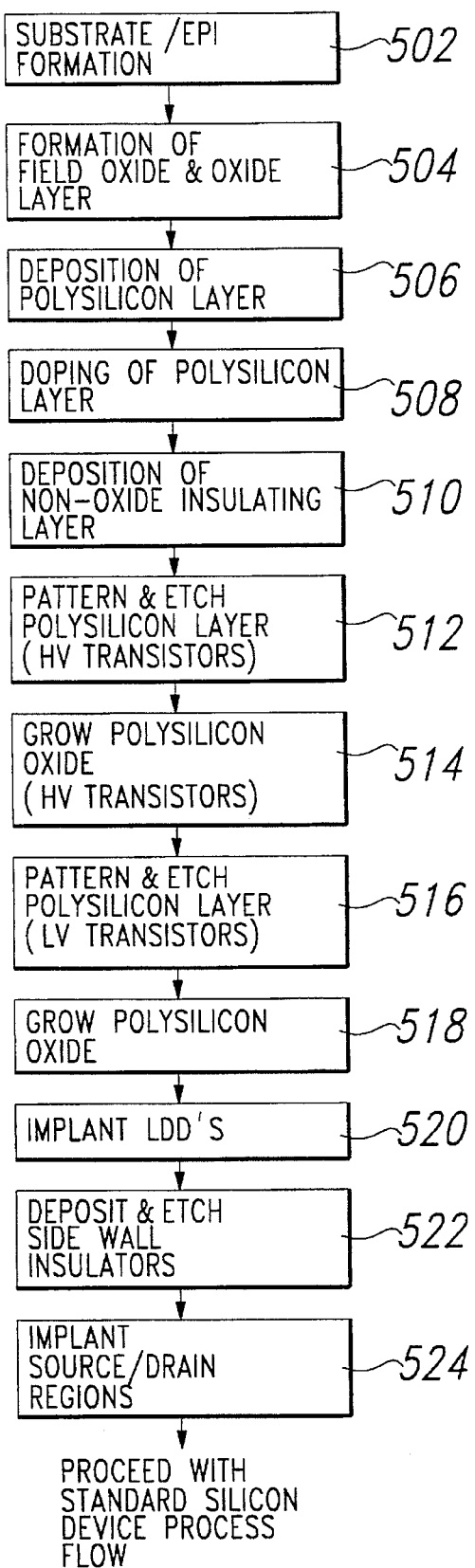
FIG. 5 is a flow chart illustrating an embodiment of the process flow of the present invention.

After the formation of gate structure 40 and the optional step of growing a polysilicon oxide, a standard process flow is utilized to complete fabrication of the devices. As illustrated in FIG. 5, the next step (step 512) is to implant lightly doped source/drain regions ("LDD's"). Next, an insulator, preferably an oxide or nitride is deposited and etched so as to form side wall insulators. After the side wall insulators are formed, the source/drain regions are implanted. The device fabrication is then completed using a standard process flow.

In another embodiment of the instant invention, a thin gate oxide layer is formed under the LV and HV transistors. The thickness of this layer is basically the desired thickness of the LV transistor. Next, a polysilicon layer is formed on the oxide layer. This is followed by a selective etch process which forms the gate structures for the HV and LV transistors. Next, LDD implants may be added to the source and drains if desired. A thin nitride layer is deposited and selectively etched so as to expose the HV transistor region only. Next, a HV poly-oxidation step is performed so as to thicken the oxide region beneath the HV transistor gate structure. The result of this step will be similar to that of HV transistor 12 in FIG. 4. Next, source/drain regions are formed. The remaining process steps are similar to any standard LV transistor or HV transistor fabrication process.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

We claim:

1. A method of simultaneously forming a first transistor and a second transistor on a single substrate for an electrical device structure, said method comprising:

providing a substrate, said substrate having a first region for said first transistor and a second region for said second transistor;

forming an oxide layer on said substrate, said oxide layer having a first thickness;

forming a conductive layer on said oxide layer, said conductive layer covering said oxide layer and said substrate in said first region and said second region;

removing portions of said conductive layer in said first region to form a gate structure for said first transistor and so as to leave said conductive layer remaining in said second region;

after forming said gate structure for said first transistor, thickening said oxide layer under the entire width of said gate structure for said first transistor to a second thickness while leaving said oxide layer in said second region at said first thickness; and removing portions of said conductive layer in said second region so as to form a gate structure for said second transistor, said oxide layer having a thickness of said first thickness is disposed between said gate structure for said second transistor and said substrate.

2. The method of claim 1 wherein a blocking layer is formed on said conductive layer.

3. The method of claim 2 wherein said blocking layer is formed prior to said step of said removing portions of said conductive layer in said second region, and portions of said blocking layer are removed during said step of removing portions of said conductive layer in said second region.

4. The method of claim 2 wherein said blocking layer is comprised of a material selected from the group of: silicon nitrides, titanium nitrides, or any combination thereof.

5. The method of claim 2 wherein said blocking layer is comprised of $Si_2N_4$.

6. The method of claim 2 wherein said blocking layer is comprised of TiN.

7. The method of claim 1 wherein said step of thickening said oxide layer is performed by subjecting said electrical device structure to a dry oxidizing atmosphere at between 800° C. and 1000° C.

8. The method of claim 7 wherein said step of subjecting said electrical device structure to a dry oxidizing atmosphere is performed by subjecting said electrical device to said atmosphere for 30 to 50 minutes.

9. The method of claim 8 wherein said oxide layer will have a thickness of between 80 and 100Å for said gate structure for said first transistor that is approximately 0.6 μm wide.

10. The method of claim 8 wherein said oxide layer will have a thickness of between 50 and 70Å for said gate structure for said first transistor that is approximately 0.35 μm wide.

11. The method of claim 1 wherein said step of thickening said oxide layer is performed by subjecting said electrical device structure to a steam atmosphere at between 800° C. and 1000° C.

12. The method of claim 11 wherein said step of subjecting said electrical device structure to a wet oxidizing atmosphere is performed by subjecting said electrical device to said wet oxidizing atmosphere for 10 to 50 minutes.

13. The method of claim 12 wherein said oxide layer will have a thickness of between 80 and 100Å for said gate structure for said first transistor that is approximately 0.6 μm wide.

14. The method of claim 12 wherein said oxide layer will have a thickness of between 50 and 70Å for said gate structure for said first transistor that is approximately 0.35 μm wide.

* * * * *